United States Patent
Lee et al.

(10) Patent No.: US 10,249,681 B2
(45) Date of Patent: Apr. 2, 2019

(54) CROSS-POINT MEMORY ARRAY DEVICE AND METHOD OF MANUFACTURING THE SAME

(71) Applicant: SK hynix Inc., Icheon (KR)

(72) Inventors: Jong Chul Lee, Seoul (KR); Jongho Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/828,014

(22) Filed: Nov. 30, 2017

(65) Prior Publication Data
US 2018/0315796 A1    Nov. 1, 2018

(30) Foreign Application Priority Data
Apr. 28, 2017    (KR) .................. 10-2017-0055743

(51) Int. Cl.
| | |
|---|---|
| H01L 27/22 | (2006.01) |
| H01L 27/24 | (2006.01) |
| H01L 43/02 | (2006.01) |
| H01L 43/08 | (2006.01) |
| H01L 43/10 | (2006.01) |
| H01L 43/12 | (2006.01) |
| H01L 45/00 | (2006.01) |
| H01L 23/528 | (2006.01) |

(52) U.S. Cl.
CPC ........ *H01L 27/2463* (2013.01); *H01L 23/528* (2013.01); *H01L 27/224* (2013.01); *H01L 27/2409* (2013.01); *H01L 43/02* (2013.01); *H01L 43/08* (2013.01); *H01L 43/10* (2013.01); *H01L 43/12* (2013.01); *H01L 45/04* (2013.01); *H01L 45/06* (2013.01); *H01L 45/1233* (2013.01); *H01L 45/1253* (2013.01); *H01L 45/142* (2013.01); *H01L 45/143* (2013.01); *H01L 45/144* (2013.01); *H01L 45/146* (2013.01); *H01L 45/147* (2013.01); *H01L 45/165* (2013.01); *H01L 45/1608* (2013.01); *H01L 45/1675* (2013.01)

(58) Field of Classification Search
CPC . H01L 51/56; H01L 51/5253; H01L 51/0097; H01L 27/3244; H01L 2227/323
USPC .......................................................... 257/4
See application file for complete search history.

(56) References Cited

U.S. PATENT DOCUMENTS

| | | | |
|---|---|---|---|
| 9,543,513 B2 | 1/2017 | Kim et al. | |
| 2008/0315359 A1 | 12/2008 | Happ et al. | |
| 2016/0358976 A1* | 12/2016 | Eun ..................... | H01L 27/2463 |

\* cited by examiner

*Primary Examiner* — Andy Huynh

(57) ABSTRACT

A method of manufacturing a cross-point memory array device is disclosed. In the method, a substrate is provided. A plurality of first conductive line patterns are formed over the substrate. An insulating layer is formed over the first conductive line patterns. The insulating layer includes an insulative oxide. A plurality of switching film patterns are formed on the first conductive line patterns by selectively doping a plurality regions of the insulating layer. A plurality of memory structures are formed on the plurality of switching film patterns, respectively. A plurality of second conductive line patterns are formed on the plurality of memory structures.

5 Claims, 23 Drawing Sheets

CROSS-POINT MEMORY ARRAY DEVICE AND METHOD OF MANUFACTURING THE SAME

CROSS-REFERENCE TO RELATED APPLICATION

The present application claims priority under 35 U.S.C 119(a) to Korean Patent Application No. 10-2017-0055743, filed on Apr. 28, 2017, which is herein incorporated by reference in its entirety.

BACKGROUND

1. Technical Field

Embodiments of the present disclosure generally relate to a cross-point memory array device and a method of manufacturing the same.

2. Related Art

Cross-point memory array devices have been employed in cell regions of memory devices requiring high integration. More specifically, cross-point memory array devices have been included in memories such as a Resistive Random Access Memory (ReRAM), a Phase Change Random Access memory (PCRAM), a Magnetic Random Access Memory (MRAM), and so on, as cell structures.

A cross-point memory array device may include a unit cell with a pillar-shaped structure. The pillar-shaped structure is interposed between electrodes disposed on different planes, the electrodes intersecting with each other.

However, in the cross-point memory array device, a sneak current that occurs between adjacent cells may cause writing errors or reading errors, with respect to information being written or stored in the cell.

In order to suppress these errors, a selecting element has been employed in a cell. Switching devices, such as transistors, diodes, tunnel barrier devices, and ovonic threshold switches, have been suggested as selecting elements.

SUMMARY

There is disclosed a method of manufacturing a cross-point memory array device according to an aspect of the present disclosure. In the method, a substrate is provided. A plurality of first conductive line patterns are formed over the substrate. An insulating layer is formed over the first conductive line patterns. The insulating layer includes an insulative oxide. A plurality of switching film patterns are formed on the first conductive line patterns by selectively doping a plurality of regions of the insulating layer. A plurality of memory structures are formed on the plurality of switching film patterns, respectively. A plurality of second conductive line patterns are formed on the plurality of memory structures.

There is disclosed a cross-point memory array device according to another aspect of the present disclosure. The cross-point memory array device includes a plurality of first conductive line patterns disposed on a substrate. The plurality of first conductive line patterns extend in a first direction. The cross-point memory array device includes an insulating layer disposed on the first conductive line patterns. The insulating layer has a plurality of insulating film patterns and a plurality of switching film patterns, respectively. The cross-point memory array device includes a plurality of memory structures disposed on the plurality of switching film patterns, respectively. The cross-point memory array device includes a plurality of second conductive line patterns disposed on the plurality of memory structures, and the plurality of second conductive line patterns extend in a second direction that is nonparallel to the first direction. Each of the plurality of switching film patterns has a variable resistance characteristic.

DETAILED DESCRIPTION

Figure 1:
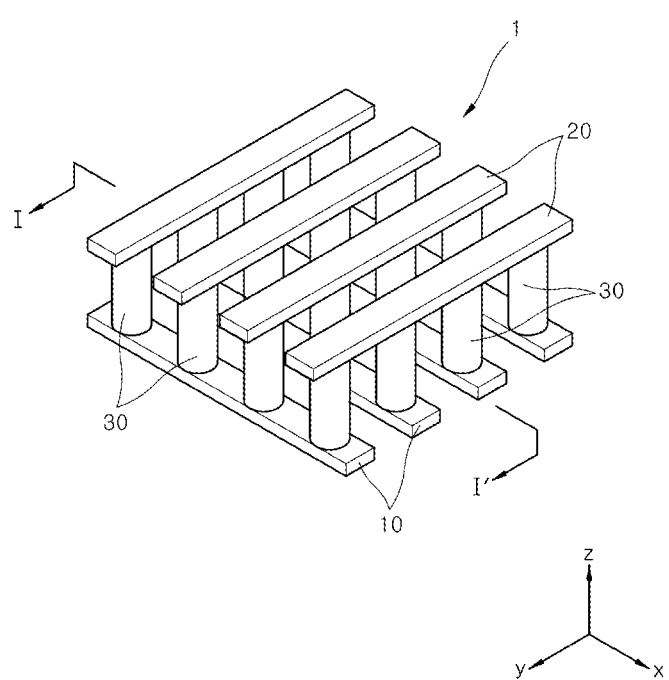
FIG. 1 is a perspective view schematically illustrating a cross-point memory array device according to an embodiment of the present disclosure.

Various embodiments will now be described with reference to the accompanying drawings. In the drawings, the dimensions of layers and regions may be exaggerated for clarity of illustration. The drawings are described with respect to an observer's viewpoint. If an element is referred to be located "on" another element, it may be understood that the element is directly located on the other element, or an additional element may be interposed between the element and the other element. The same reference numerals refer to the same elements throughout the specification.

In addition, an expression of a singular form of a word should be understood to include the plural forms of the word unless clearly used otherwise in context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

Figure 2:
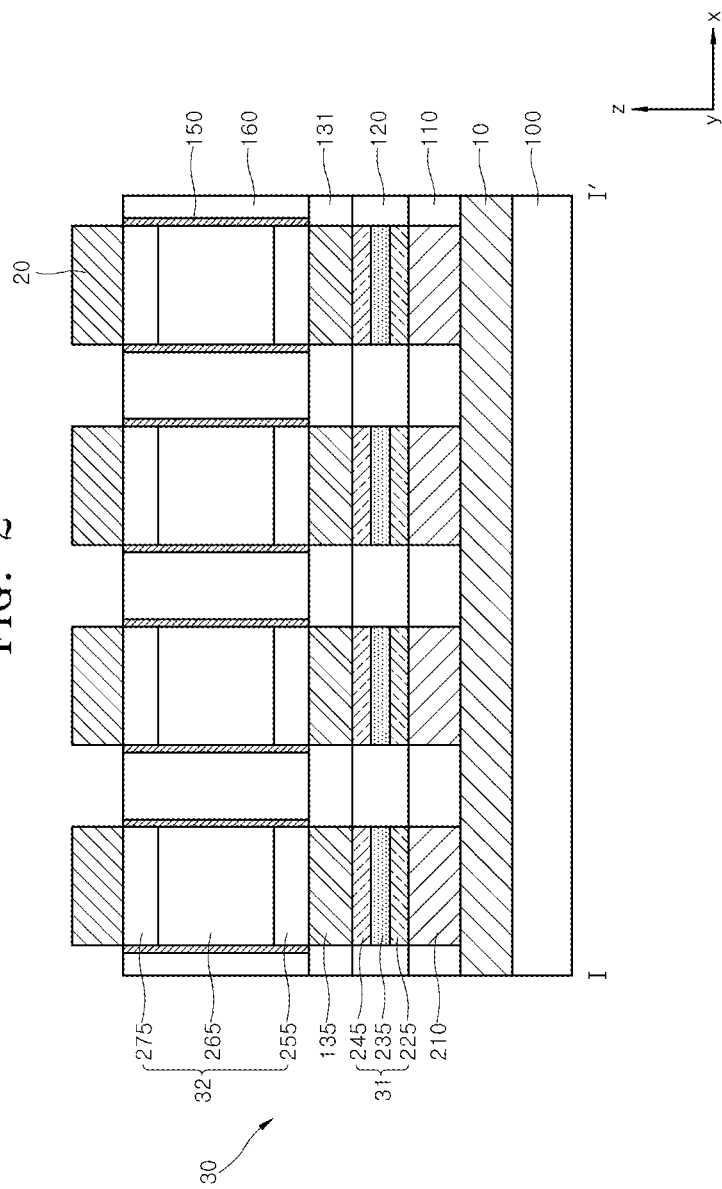
FIG. 2 is a cross-sectional view schematically illustrating a cross-point memory array device according to an embodiment of the present disclosure.

FIG. 1 is a perspective view schematically illustrating a cross-point memory array device 1 according to an embodiment of the present disclosure. FIG. 2 is a cross-sectional view schematically illustrating a cross-point memory array device according to an embodiment of the present disclosure. For example, FIG. 2 is a cross-sectional view taken along line I-I' of the cross-point memory array device 1 of FIG. 1.

In FIG. 1, for convenience of illustration, a substrate and a plurality of insulating layers located in the cross-point memory array device 1 are omitted. In an embodiment, the cross-point memory array device 1 may be included in nonvolatile memories, such as a Resistive Random Access Memory (ReRAM), a Phase Change Random Access memory (PCRAM), and a Magnetic Random Access Memory (MRAM).

Referring to FIG. 1, the cross-point memory array device 1 may include first conductive line patterns 10 extending in a first direction, for example, an x-direction; second conductive line patterns 20 extending in a second direction, for example, a y-direction; and unit cell structures 30 disposed in a region where the first and second conductive patterns 10 and 20 intersect each other along a third direction, for example, a z-direction. In the illustrated embodiment, although the first direction and the second direction are illustrated with respect to an orthogonal coordinate system, in which the first direction and the second direction are orthogonal to each other, the present disclosure is not limited thereto and various modifications may be made, as long as the first direction and the second direction are nonparallel to each other. As used herein, the term "nonparallel" refers to directions that are not parallel. Nonparallel directions may be perpendicular, orthogonal, or oblique to one another.

The unit cell structures 30 may constitute a plurality of arrays extending along the first and second directions. For example, a first array of unit cell structures 30 are spaced apart along the first direction, and a second array of unit cell structures 30 are spaced apart along the second direction. The first array of unit cell structures 30 intersects the second array of unit cell structures 30, such that one of the first array of unit cell structures 30 is shared by the second array of unit cell structures 30.

Referring to FIGS. 1 and 2, each of the unit cell structures 30 may include a contact plug 210, a resistive element structure 31, a switching film pattern 135, and a memory structure 32, which are sequentially stacked on the first conductive line pattern 10. The memory structure 32 may include a first memory electrode layer pattern 255, a memory film pattern 265, and a second memory electrode layer pattern 275.

Portions of the contact plug 210, portions of the resistive element structure 31, portions of the switching film pattern 135, and portions of the memory structure 32 may overlap each other along different planes. According to various embodiments, various structures overlap each other along different planes by overlapping each other at interfaces between the various structures. As an example, at least a portion of the contact plug 210 and a portion of the resistive element structure 31 may overlap each other in the z direction at an interface between the contact plug 210 and the resistive element structure 31. As another example, at least a portion of the resistive element structure 31 and a portion of the switching film pattern 135 may overlap each other in the z direction at an interface between the resistive element structure 31 and the switching film pattern 135. As another example, at least a portion of the switching film pattern 135 and a portion of the memory structure 32 may overlap each other in the z direction at an interface between the switching film pattern 135 and the memory structure 32.

Referring to FIG. 2, a substrate 100 may be provided. The substrate 100 may be a semiconductor substrate, as a non-limiting example. Specifically, the substrate 100 may be any of a silicon (Si) substrate, a gallium arsenide (GaAs) substrate, an indium phosphide (InP) substrate, a germanium (Ge) substrate, a silicon germanium (SiGe) substrate, and a silicon-on-insulator (SOI) substrate, as non-limiting examples. The substrate 100 may be doped with a dopant having an n-type or p-type conductivity. The substrate 100 may have a well at least partially doped with a dopant having an n-type or p-type conductivity.

The first conductive line patterns 10 may extend in the first direction along the substrate 100. The first conductive line pattern 10 may include any of a metal, a conductive metal nitride, and a conductive metal oxide, as non-limiting examples. The plurality of unit cell structures 30 may share the first conductive line patterns 10 with each other. For example, multiple unit cell structures 30 may be connected to one of the first conductive line patterns 10.

The contact plugs 210 may be disposed on the first conductive line patterns 10. The contact plugs 210 may electrically connect the first conductive line patterns 10 to the resistive element structure 31. Each of the contact plugs 210 may include any of a metal, a conductive metal nitride, a conductive metal oxide, and so on. A first insulating layer 110 may be disposed on the first conductive line patterns 10 and may fill spaces between the contact plugs 210. The first insulating layer 110 may include any of an oxide, a nitride, and an oxynitride, as non-limiting examples.

The resistive element structures 31 may be disposed on the contact plugs 210, respectively. Each resistive element structure 31 may include a first electrode layer pattern 225, a resistive layer pattern 235, and a second electrode layer pattern 245. The resistive element structure 31 may be electrically connected to the switching film pattern 135 and the memory structure 32 in series, within each of the unit cell structures 30.

The resistive element structure 31 may set an upper limit of an operating current that passes through the switching film pattern 135 or the memory structure 32, and that passes between the first and second conductive line patterns 10 and 20. In an embodiment, the resistive element structure 31 prevents an excessive current from flowing suddenly into the unit cell structure 30, for example, when a resistive state of the switching film pattern 135 or the memory film pattern 265 is converted from a high resistance state to a low resistance state by a voltage applied between the first and second conductive line patterns 10 and 20. The resistive element structure 31 therefore prevents the switching film pattern 135 or the memory film pattern 265 from being electrically broken by an excessive current. The resistive layer pattern 235 of the resistive element structure 31 can be set to have a predetermined resistance corresponding to a maximum operating current allowed in the unit cell structure 30.

The resistive layer pattern 235 may include any of an oxide, a nitride, and an oxynitride, as non-limiting examples. The predetermined resistance of the resistive layer pattern 235 can be controlled by a characteristic of a material included in the resistive layer pattern 235, a thickness of the resistive layer pattern 235, or both. The first and second electrode layer patterns 225 and 245 may include any of a metal, a conductive metal nitride, and a conductive metal oxide, as non-limiting examples.

A second insulating layer 120 may be disposed on the first insulating layer 110, and may fill spaces between the resistive element structures 31. The second insulating layer 120 may include any of an oxide, a nitride, and an oxynitride, as non-limiting examples.

The resistive element structure 31 may be in the form of a plug structure that is surrounded by the second insulating layer 120. As used herein, a first structure is "surrounded" by a second structure when the second structure encloses the first structure in a specific plane. However, the first structure may be exposed by the second structure in a different direction. For example, in the present embodiment, the second insulating layer 120 may surround the resistive element structure 31 in a plane aligned with the x and y directions, and may expose the resistive element structure 31 in the z direction.

The switching film patterns 135 may be disposed on the resistive element structures 31, respectively. Each switching film pattern 135 may function as a resistance change layer of a selection element that is connected to a respective one of the memory structures 32 in the cross-point memory array device 1. Each selection element may utilize the second electrode layer pattern 245 of a respective resistive element structure 31, and the first memory electrode layer pattern 255 of a respective memory structure 32, as electrodes. That is, the selection element may share electrodes with the resistive element structure 31 and the memory structure 32.

The switching film pattern 135 can be switched in a volatile manner between a turn-off state and a turn-on state via a switching operation. Each of the turn-off state and the turn-on state may be a resistance state. For example, the switching film pattern 135 may be switched to the turn-on state or the turn-off state when a voltage is applied between the second electrode layer pattern 245 and the first memory electrode layer pattern 255. When the switching film pattern 135 is in the turn-on state, a current equal to or greater than a predetermined reference current flows through the switching film pattern 135 as a predetermined threshold voltage is applied across the switching film pattern 135. When the switching film pattern 135 is in the turn-off state, a current that is less than the reference current flows through the switching film pattern 135 as the threshold voltage is applied over the switching film pattern 135. In other words, the switching film pattern 135 has a lower resistance in the turn-on state than when the switching film pattern 135 is in the turn-off state.

In an embodiment, while no voltage is applied or a voltage smaller than the threshold voltage is applied across the switching film pattern 135, the switching film pattern 135 maintains the turn-off state. In an embodiment, when a voltage equal to or greater than the threshold voltage is applied across the switching film pattern 135, the state of the switching film pattern 135 changes into the turn-on state from the turn-off state. The switching film pattern 135 maintains the turn-on state only when the voltage equal to or greater than the threshold voltage is applied across the threshold switching film pattern 135. That is, the state of the switching film pattern 135 can be volatile. For example, the turn-on state of the switching film pattern 135 may not be maintained after a voltage applied across the switching film pattern 135 is removed.

In an embodiment, the switching film pattern 135 may include an insulative oxide, and dopants that are doped into the insulative oxide. In an embodiment, the insulative oxide may include silicon oxide, aluminum oxide, zirconium oxide, or a combination thereof. The dopants may include, for example, boron (B), nitrogen (N), carbon (C), phosphorus (P), aluminum (Al), lanthanum (La), niobium (Nb), vanadium (V), tantalum (Ta), tungsten (W), chrome (Cr), molybdenum (Mo), or a combination thereof, as non-limiting examples.

Insulating film patterns 131 may fill spaces between the switching film patterns 135, and may be disposed on the second insulating layer 120. The insulating film patterns 131 may include an insulative oxide. In an embodiment, the insulating film patterns 131 and the switching film patterns 135 may include the same material as each other.

In an embodiment, the switching film patterns 135 and the insulating film patterns 131 are formed by forming an insulating layer, which includes the insulative oxide, on the second insulating layer 120 and the resistive element structures 31, and then injecting a dopant into predetermined regions of the insulating layer. As a result, the switching film patterns 135 may be formed from the predetermined regions of the insulating layer into which the dopant is injected, and the insulating film patterns 131 may be formed from regions of the insulating layer without the injected dopant.

Each switching film pattern 135 can be electrically connected to a respective second electrode layer pattern 245 and to a respective first memory electrode layer pattern 255. Each switching film pattern 135 may have a variable resistance characteristic, whereas each insulating film pattern 131 formed from the region of the insulating layer without the injected dopant can maintain a constant level of electrical insulation. For example, each switching film pattern 135 may switch between different resistance states.

As described above, side surfaces of the switching film patterns 135 may be disposed against the insulating film patterns 131, such that the switching film patterns 135 are surrounded by the insulating film patterns 131. Since the switching film patterns 135 and the insulating film patterns 131 include the same insulative oxide, interfacial properties between the switching film patterns 135 and the insulating film patterns 131 may be improved. Therefore, the electrical insulation between the switching film patterns 135 in a lateral direction (e.g., the x direction, the y direction, or both) may be improved.

The plurality of memory structures 32 may be disposed on the switching film patterns 135, respectively. Each of the memory structures 32 may be a pillar-shaped structure. Each memory structure 32 may include the first memory electrode layer pattern 255, the memory film pattern 265, and a second memory electrode layer pattern 275. The memory structure 32 may be included in one or more nonvolatile memory devices, such as a resistive RAM, a phase change RAM, a magnetic RAM, etc.

In an embodiment, the memory structure 32 may be included in a resistive memory device. The first memory electrode layer pattern 255 and the second memory electrode layer pattern 275 may each include a metal such as any of gold (Au), platinum (Pt), copper (Cu), aluminum (Al) (Ru), titanium (Ti), iridium (Ir), tungsten (W), titanium nitride (TiN), tantalum nitride (TaN), and ruthenium oxide (RuO2), as non-limiting examples.

The memory film pattern 265 may include a metal oxide. The metal oxide may include any of titanium oxide, aluminum oxide, nickel oxide, copper oxide, zirconium oxide, manganese oxide, hafnium oxide, tungsten oxide, tantalum oxide, niobium oxide, and iron oxide, as non-limiting examples.

In an embodiment, the metal oxide may include oxygen vacancies. That is, the ratio of metal atoms to oxygen atoms in the metal oxide may exceed a stoichiometric ratio of the metal oxide. The oxygen vacancies may move through the metal of the metal oxide when a voltage is applied between the first memory electrode layer pattern 255 and the second memory electrode layer pattern 275. In other words, the oxygen vacancies may have mobility in the metal. When a voltage equal to or greater than a predetermined threshold voltage is applied to the memory film pattern 265, an arrangement of the oxygen vacancies connects the first memory electrode layer pattern 255 to the second memory electrode layer pattern 275, inside of the memory film pattern 265.

The arrangement of the oxygen vacancies affects the electrical resistance of the memory film pattern 265. For example, when the oxygen vacancies do not connect the first memory electrode layer pattern 255 to the second memory electrode pattern 275, the memory film pattern 265 is in a high resistance state. When the oxygen vacancies subsequently connect the first memory electrode layer pattern 255 to the second memory electrode layer pattern 275, the memory film pattern 265 changes from the high resistance state to a low resistance state. After the applied voltage is removed, the oxygen vacancies may maintain their positions, and may keep the first memory electrode layer pattern 255 and the second memory electrode layer pattern 275 electrically connected. Accordingly, each of the memory structures 32 may have a nonvolatile memory characteristic.

In another embodiment, the memory film pattern 265 may include a perovskite material, such as any of PCMO ($Pr_{0.7}Ca_{0.3}MnO_3$), LCMO ($La_{1-x}Ca_xMnO_3$), BSCFO ($Ba_{0.5}Sr_{0.5}Co_{0.8}Fe_{0.2}O_{3-\delta}$), YBCO ($YBa_2Cu_3O_{7-x}$), (Ba, Sr)$TiO_3$(Cr, Nb-doped), $SrZrO_3$(Cr, V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the like, as non-limiting examples. In yet another embodiment, the memory film pattern 265 may include, for example, any of a selenide material, such as $Ge_xSe_{1-x}$(Ag,Cu,Te-doped) or a metal sulfide material; an $Ag_2S$ material; a $Cu_2S$ material; a CdS material; and a ZnS material.

The resistance of the memory film pattern 265 can be changed by applying a voltage to the memory film pattern 265. Specifically, a resistance state of the memory film pattern 265 varies when the applied voltage changes a barrier height or a barrier width at the interfaces between the memory film pattern 265 and the memory electrode layer patterns 255 and 275. Alternatively, the resistance state of the memory film pattern 265 varies when the applied voltage forms or disconnects a conductive filament between the first and second memory electrode layer patterns 255 and 275 in the memory film pattern 265.

In another embodiment, the memory structure 32 may be included in a phase-change RAM device. The first memory electrode layer pattern 255 and the second memory electrode layer pattern 275 may include any of tungsten (W), aluminum (Al), copper (Cu), tantalum (Ta), titanium (Ti), molybdenum (Mo), tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, impurity-doped polysilicon, and so on, as non-limiting examples.

The memory film pattern 265 may include a chalcogenide-based compound, as a non-limiting example. The memory film pattern 265 may include any of germanium-antimony-tellurium (GST), arsenic-antimony-tellurium (As—Sb—Te), tin-indium-antimony-tellurium (Sn—In—Sb—Te), and arsenic-germanium-antimony-tellurium (As—Ge—Sb—Te), as non-limiting examples. The memory film pattern 265 may include a chalcogenide compound including any of a Group 5A element-antimony-tellurium, a Group 6A element-antimony-tellurium, a Group 5A element-antimony-selenium, and a Group 6A element-antimony-selenium, as non-limiting examples.

In the memory structure 32, a phase of the memory film pattern 265 can be changed using joule-heating, which may be provided through the first memory electrode layer pattern 255 and the second memory electrode layer pattern 275. The resistance of the memory film pattern 265 varies in accordance with the phase change. In addition, the memory film pattern 265 maintains its phase after the joule-heating ends. Accordingly, the memory film pattern 265 may have a nonvolatile memory characteristic.

In another embodiment, the memory structure 32 may include a magnetic change memory device. The first memory electrode layer pattern 255 and the second memory electrode layer pattern 275 may each include any of tungsten (W), aluminum (Al), copper (Cu), tantalum (Ta), titanium (Ti), molybdenum (Mo), tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, and impurity-doped polysilicon, as non-limiting examples.

Although not illustrated, the memory film pattern 265 may have a structure including a free layer pattern, a tunnel barrier layer pattern, and a fixed layer pattern. The magnetization direction of electrons in the free layer pattern may change. The free layer pattern may include a ferromagnetic material, such as any of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), and so on. The tunnel barrier layer pattern may be disposed between the free layer pattern and the fixed layer pattern. The tunnel barrier layer pattern may include any of magnesium oxide (MgO), aluminum oxide ($Al_2O_3$), and so on, as non-limiting examples. The magnetization direction of electrons in the fixed layer pattern may be fixed. The fixed layer pattern may include a ferromagnetic material, such as any of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), and so on. The fixed layer pattern may be a single layer structure or a multi-layer structure. For example, the fixed layer pattern may have a SAF (Synthetic AntiFerromagnetic) structure.

By applying an external voltage to the memory film pattern 265, the magnetization direction of electrons in the free layer pattern can be changed. The resistance of the memory film pattern 265 varies in accordance with the electro-magnetization direction in the free layer pattern. When the external voltage is removed, the memory film pattern 265 maintains its resistance. Accordingly, the memory film pattern 265 has a nonvolatile memory characteristic.

Referring to FIG. 2, insulating spacers 150 may be disposed on side surfaces of the memory structures 32. In an embodiment, the insulating spacers 150 may include a nitride material. For example, the insulating spacer 150 may include silicon nitride. The insulating spacers 150 can electrically insulate the sides of the memory structures 32.

As a comparative example, when the insulating spacers 150 include an oxide material, the first and second memory electrode layer patterns 255 and 275 may also be oxidized in the process of forming the insulating spacers 150, thereby deteriorating the conductivity of the first and second memory electrode layer patterns 255 and 275. In another case, in the process of forming the insulating spacers 150, the oxygen vacancy concentration of the memory film pattern 265 may be reduced by oxidizing the memory film pattern 265. However, when the insulating spacers 150 include the nitride material, the deterioration of electrical characteristics of the first and second memory electrode layer patterns 255 and 275, due to oxidation of the first and second memory electrode layer patterns 255 and 275, can be suppressed.

Referring to FIG. 2, an insulating material layer 160 may be disposed over the substrate 100, and may fill spaces between the plurality of memory structures 32. The insulating material layer 160 may include an insulating oxide film. As an example, the insulating material layer 160 may be a silicon oxide film.

The second conductive line patterns 20 may be disposed over the plurality of memory structures 32. The second conductive line patterns 20 may be electrically connected to the second memory electrode layer patterns 275. The second conductive line patterns 20 may extend in the second direction, which is nonparallel to the first direction. Accordingly, the second conductive line patterns 20 may cross the first conductive line patterns 10, which extends in the first direction, in the third direction. The second conductive line pattern 20 may include any of a metal, a conductive metal nitride, and a conductive metal oxide, as non-limiting examples. Each of the second conductive line patterns 20 may be connected to more than one of the cell structures 30.

According to the above-described embodiment, each unit cell structure 30 may include the resistive element structure 31, the switching film pattern 135, and the memory structure 32. The insulating spacers 150 are disposed on side surfaces of the memory structures 32, but may be omitted from being disposed on side surfaces of the switching film patterns 135 and on side surfaces of the resistive element structures 31. The insulating spacers 150 disposed on the side surfaces of the memory structures 32 may include a nitride material, in order to inhibit lateral oxidation of the memory structures 32.

The switching film patterns 135 may include doped regions of an insulating layer that contains an insulative oxide. By arranging undoped regions of the insulating layer around each of the switching film patterns 135, the electrical insulation of each of the switching film patterns 135 in a lateral direction can be improved.

In some other embodiments, the resistive element structure 31 may be omitted, and the contact plug 210 can be directly connected to the switching film pattern 135.

Figure 3:
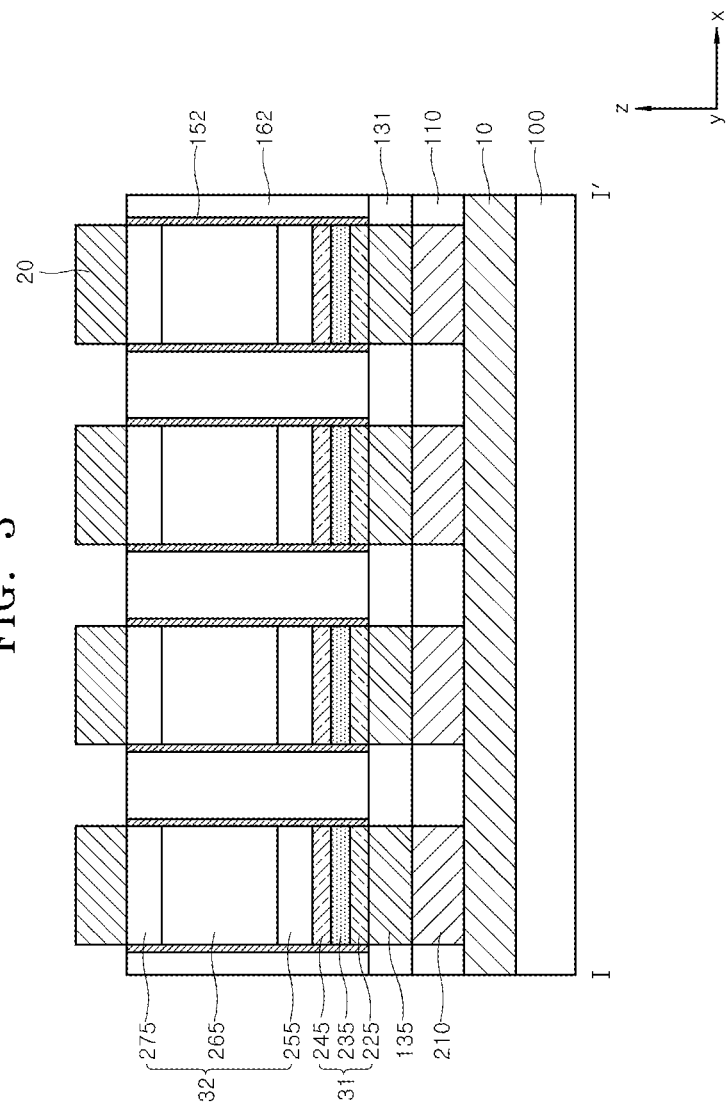
FIG. 3 is a cross-sectional view schematically illustrating a cross-point memory array device according to another embodiment of the present disclosure.

FIG. 3 is a cross-sectional view schematically illustrating a cross-point memory array device according to another embodiment of the present disclosure. FIG. 3 may be a cross-sectional view taken along line I-I' of the cross-point array device 1 of FIG. 1 according to another embodiment of the present disclosure.

The cross-point memory array device illustrated in FIG. 3 differs from the cross-point memory array device of FIG. 2 in that the resistive element structures 31 are arranged between the switching film patterns 135 and the memory structures 32.

Referring to FIG. 3, insulating spacers 152 may be disposed on sides of the resistive element structures 31 and the memory structures 32. The insulating spacers 152 may include a nitride material. As one example, the insulating spacers 152 may be part of a silicon nitride film. The insulating spacers 152 may electrically isolate the sides of the resistive element structures 31 and the sides of the memory structures 32.

An insulating material layer 162 may fill spaces between the insulating spacers 152, which are formed on the sides of the resistive element structures 31 and the memory structures 32. Accordingly, the insulating material layer 162 may be disposed between structures, each of the structures including the resistive element structure 31 and the memory structure 32. The insulating material layer 162 may include an oxide film. As an example, the insulating material layer 162 may include a silicon oxide film.

In some other embodiments, the second electrode layer pattern 245 of the resistive element structure 31, or the first memory electrode layer pattern 255 of the memory structure 32, may be omitted.

Figure 4:
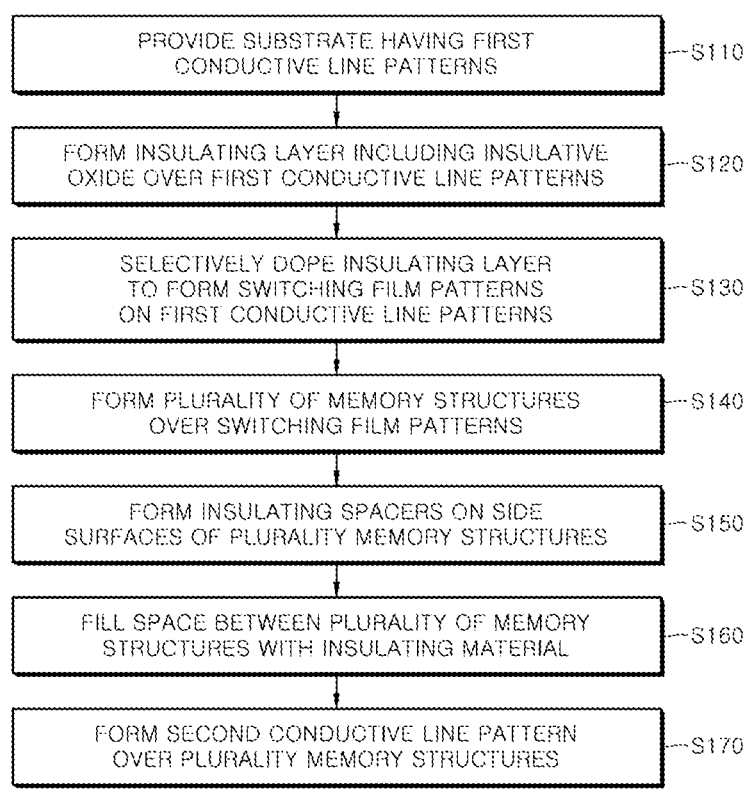
FIG. 4 is a flow chart schematically illustrating a method of manufacturing a cross-point memory array device according to an embodiment of the present disclosure.

FIG. 4 is a flow chart schematically illustrating a method of manufacturing a cross-point memory array device according to an embodiment of the present disclosure. The method of manufacturing the cross-point memory array device illustrated in FIG. 4 can be applied to a method of manufacturing a volatile memory device, such as a resistive RAM, a phase change RAM, or a magnetic RAM.

Referring to step S110 of FIG. 4, a substrate having first conductive line patterns may be provided. The substrate may be a semiconductor substrate, such as a silicon substrate. The first conductive line patterns may extend in a first direction. The first conductive line patterns may include any of a metal, a conductive nitride, and a conductive oxide, as non-limiting examples.

Referring to step S120, an insulating layer including an insulative oxide may be formed over the first conductive line patterns. The insulating layer may include silicon oxide, aluminum oxide, zirconium oxide, or a combination thereof, as non-limiting examples.

Referring to step S130, the insulating layer may be selectively doped to form switching film patterns on the first conductive line patterns, respectively. In an embodiment, the insulating layer may be doped with a dopant by an ion implantation method using an ion implanting mask. The dopant may include boron (B), nitrogen (N), phosphorous (P), aluminum (Al), lanthanum (La), niobium (Nb), vanadium (V), tantalum (Ta), tungsten (W), chrome (Cr), molybdenum (Mo), or a combination thereof, as non-limiting examples.

Referring to step S140, a plurality of memory structures may be formed over the switching film patterns, respectively. In an embodiment, the plurality of memory structures may be formed by sequentially forming a plurality of films over the switching film patterns and patterning the plurality of films. At this time, the memory structures and the switching film patterns may be formed such that at least portions of the memory structures overlap each other on different planes.

In an embodiment, the memory structures may each include a first memory electrode layer pattern, a memory film pattern, and a second memory electrode layer pattern. Each memory structure may include a memory element having an electrical resistance that varies in accordance with an applied voltage.

Referring to step S150, insulating spacers may be formed on side surfaces of the plurality of memory structures. The insulating spacers may include a nitride material, as a non-limiting example. The insulating spacers may each include a silicon nitride film, as a non-limiting example.

Referring to step S160, spaces between the plurality of memory structures may be filled with an insulating material. The insulating material may be disposed over the substrate. The insulating material may include an oxide material. The insulating material may include a silicon oxide film, as a non-limiting example.

Referring to step S170, second conductive line patterns may be formed over the plurality of memory structures. The second conductive line patterns may extend in a second direction that is nonparallel to the first direction. The second conductive line patterns may cross the first conductive line patterns, which extend the first direction, in a third direction. The second conductive line patterns may each include any of a metal, a conductive metal nitride, and a conductive metal oxide, as non-limiting examples.

The cross-point memory array device including the plurality of unit cell structures between the first and second conductive line patterns may be manufactured by performing the steps including S110 through S170. After step S170 is performed, each unit cell structure may include a respective switching film pattern and a respective memory structure.

In a unit cell, an insulating spacer may be formed on a side surface of a memory structure. By including a nitride material in the insulating spacer, lateral oxidation of the memory structure can be suppressed, thereby suppressing deterioration of electrical characteristics of the unit cell.

Switching film patterns may be formed by selectively doping regions of an insulating layer, which contains an insulative oxide, with a dopant. Regions of the insulating layer that are undoped remain surrounding the switching film patterns, respectively. Accordingly, the electrical insulation of the switching film pattern in a vertical direction (e.g., the third direction) or a lateral direction (e.g., the first direction, the second direction, or both) can be improved without introducing a separate spacer.

FIGS. 5 to 13 are cross-sectional views schematically illustrating a method of manufacturing a cross-point memory array device according to an embodiment of the present disclosure. FIGS. 5 to 13 are process diagrams corresponding to cross sections taken along line I-I' of the cross-point array device illustrated in FIG. 1 according to an embodiment of the present disclosure.

Figure 5:
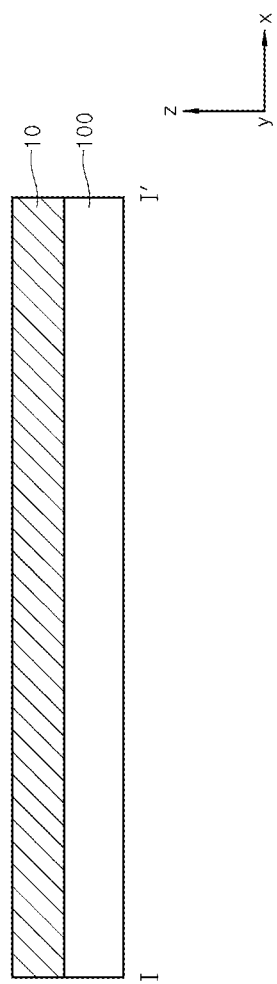
FIGS. 5 to 13 are cross-sectional views schematically illustrating a method of manufacturing a cross-point memory array device according to an embodiment of the present disclosure.

Referring to FIG. 5, a substrate 100 may be provided. The substrate 100 may be a semiconductor substrate, as a non-limiting example. Specifically, the substrate 100 may be any of a silicon substrate, a gallium arsenide substrate, an indium phosphide (InP) substrate, a germanium (Ge) substrate, and a silicon germanium (SiGe) substrate, and a silicon-on-insulator (SOI) substrate, as non-limiting examples. The substrate 100 may be doped with a dopant having an n-type or p-type conductivity. The substrate 100 may have a well, which is at least partially doped with a dopant having an n-type or p-type conductivity.

First conductive line patterns 10, which extend in a first direction, may be formed on the substrate 100. The first direction is an x direction, for example. The first conductive line pattern 10 may include any of a metal, a conductive metal nitride, and a conductive metal oxide, as non-limiting examples. Each of the first conduction line patterns 10 may be shared by multiple unit cell structures 30, which are arranged along the first direction.

In one embodiment, the method of forming the first conductive line patterns 10 may proceed according to the following process. A base insulating layer (not illustrated) may be formed on the substrate 100. The base insulating layer may be patterned to form trench patterns, which extend in the first direction and partially expose the substrate 100.

A conductive material film, which fills spaces between the trench patterns, may be formed over the substrate 100. The conductive material film may be polished so that an upper surface of the base insulating layer and an upper surface of the conductive material film may be coplanar. The base insulating layer may include any of an oxide, a nitride, and an oxynitride, as non-limiting examples.

The base insulating layer may be disposed between the first conductive line patterns 10, and may insulate the first conductive line patterns 10 from each other in a second direction, e.g., a y direction.

In an embodiment, the base insulating layer may be formed by any of a chemical vapor deposition method, an atomic layer deposition method, and a coating method, as non-limiting examples. The conductive material film may be formed using a chemical vapor deposition method or an atomic layer deposition method, as non-limiting examples. The conductive material film may be polished using a chemical mechanical polishing method, as a non-limiting example.

Although not illustrated in FIG. 5, at least one of a circuit pattern layer and an insulating layer may be disposed between the substrate 100 and the first conductive line patterns 10. One or more stacked circuit pattern layers may be connected to the substrate 100 by conductive vias or plugs. Alternatively, stacked multilayer circuit pattern layers may be connected to each other by conductive vias or plugs.

Figure 6:
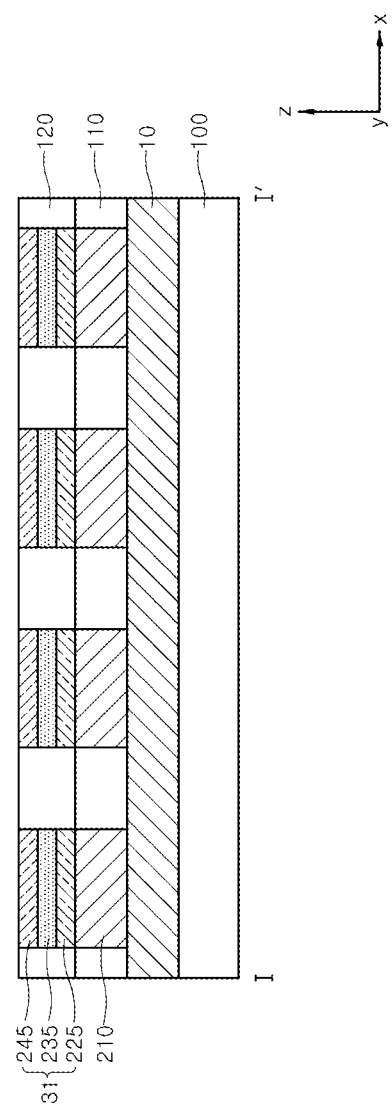

Referring to FIG. 6, contact plugs 210 and a first insulating layer 110 surrounding the contact plugs 210 may be formed over the first conductive line patterns 10. In one embodiment, the process of forming the contact plugs 210 may proceed as follows.

The first insulating layer 110 may be deposited on the first conductive line patterns 10 and the base insulating layer. The first insulating layer 110 may be patterned to form contact patterns that expose the first conductive line patterns 10. That is, the first conductive line patterns 10 are exposed between the contact patterns. Subsequently, a conductive material film, which fills spaces between the contact patterns, may be formed. The conductive material film may be polished and planarized so that upper surfaces of the conductive material film and the first insulating layer 110 are coplanar. The conductive material film remaining in the spaces between the contact patterns corresponds to the contact plugs 210. Each of the contact plugs 210 may include any of a metal, a conductive metal nitride, and a conductive metal, as non-limiting examples. The first insulating layer 110 may include any of an oxide, a nitride, and an oxynitride, as non-limiting examples.

In one embodiment, the first insulating layer 110 may be formed using a chemical vapor deposition method, an atomic layer deposition method, or a coating method, as non-limiting examples. According to an embodiment, the conductive material film may be formed using a chemical vapor deposition method or an atomic layer deposition method. The conductive material film may be polished using a chemical mechanical polishing method.

Referring again to FIG. 6, resistive element structures 31 may be formed on the contact plugs 210, respectively. Each resistive element structure 31 has a predetermined resistance, and can thereby set an upper limit of an operating current passing through the corresponding unit cell structure.

In one embodiment, the process of forming the resistive element structures 31 may proceed as follows. A first electrode layer, a resistive film, and a second electrode layer may be sequentially stacked on the first insulating layer 110 and the contact plugs 210. The first and second electrode layers may comprise any of a metal, a conductive metal nitride, and a conductive metal oxide, as non-limiting examples. The resistive film may include any of an oxide, a nitride, and an oxynitride, as non-limiting examples. First electrode layer patterns 225, resistive film patterns 235, and second electrode layer patterns 245, which are electrically connected to the contact plugs 210, may be formed by selectively etching the first electrode layer, the resistive film, and the second electrode layer, respectively. Thus, the resistive element structures 31, which each include the first electrode layer pattern 225, the resistive film pattern 235, and the second electrode layer pattern 245, can be formed.

Next, an insulating material layer may be formed on the first insulating layer 110. The insulating material layer may fill spaces between the plurality of resistive element structures 31. Then, a second insulating layer 120 is formed by polishing the insulating material layer. As a result of the polishing, an upper surface of the second insulating layer 120 and an upper surface of the second electrode layer pattern 245 may be coplanar.

In one embodiment, the first electrode layer, the resistive film, and the second electrode layer may each be formed using a chemical vapor deposition method or an atomic layer deposition method, as non-limiting examples. The insulating material film may be formed using any of a chemical vapor deposition method, an atomic layer deposition method, and a coating method. The insulating material film may be polished using a chemical mechanical polishing method.

Figure 7:
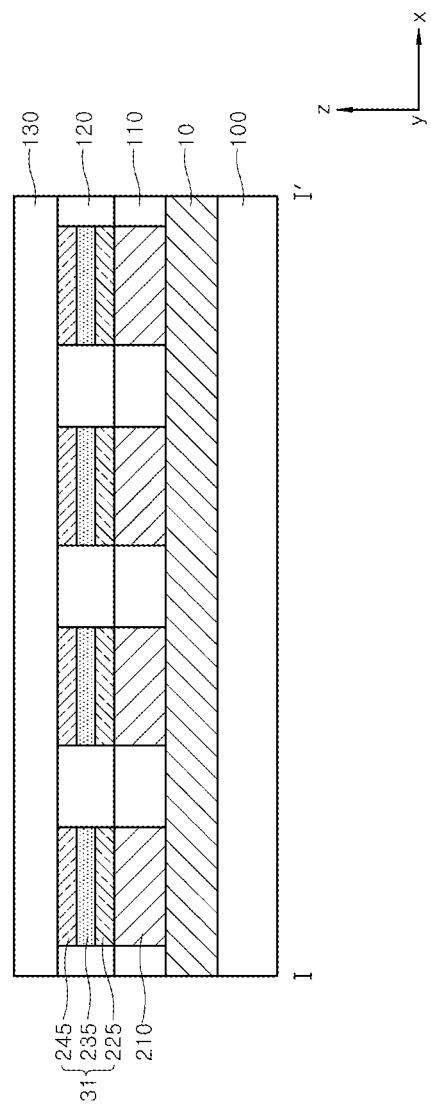

Referring to FIG. 7, an insulating layer 130 including an insulative oxide may be formed over the resistive element structures 31 and the second insulating layer 120. The insulating layer 130 may include silicon oxide, aluminum oxide, zirconium oxide, or combinations thereof, as non-limiting examples. The insulating layer 130 may be formed using a chemical vapor deposition method or an atomic layer deposition method, as non-limiting examples.

Figure 8:
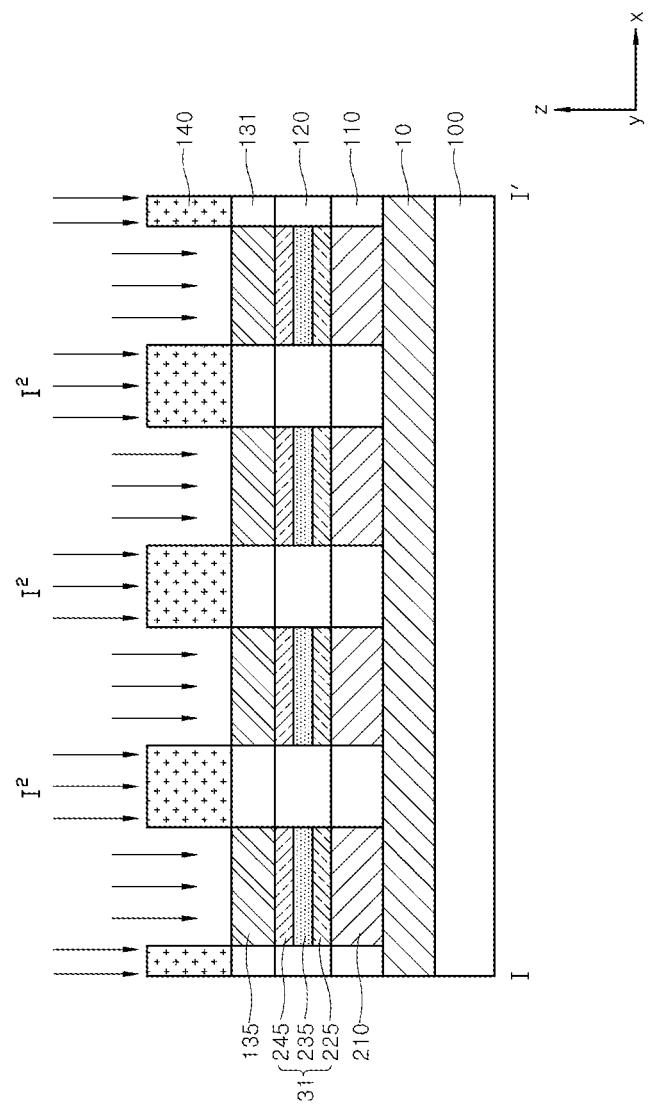

Referring to FIG. 8, an ion implantation mask pattern 140, which selectively exposes the insulating layer 130, may be formed on the insulation layer 130. Regions of the insulating layer 130 exposed by the ion implantation mask pattern 140 may overlap the resistive element structures 31. Subsequently, a dopant $I^2$ may be implanted into the regions of the insulating layer 130 that are selectively exposed by the ion implantation mask pattern 140. The dopant $I^2$ may include boron (B), nitrogen (N), carbon (C), phosphorus (P), aluminum (Al), lanthanum (La), niobium (Nb), vanadium (V), tantalum (Ta), tungsten (W), chromium (Cr), molybdenum (Mo), or a combination thereof, as non-limiting examples.

In the dopant ion implantation process, the insulating layer 130 may be defined into volatile variable resistance regions and electrically insulative regions. The regions of the insulating layer 130 implanted with the dopant $I^2$ correspond to the volatile variable resistance regions, which may function as switching film patterns 135. The dopant $I^2$ is blocked from being implanted into regions of the insulating layer 130 corresponding to the electrically insulative regions, which may function as insulating film patterns 131. After the dopant implantation process is completed, the ion implantation mask pattern 140 may be removed.

As shown in FIG. 8, the plurality of switching film patterns 135 may be electrically connected to the plurality of second electrode layer patterns 245, respectively. The side surfaces of the plurality of switching film patterns 135 may be bounded by the plurality of insulating film patterns 131.

Figure 9:
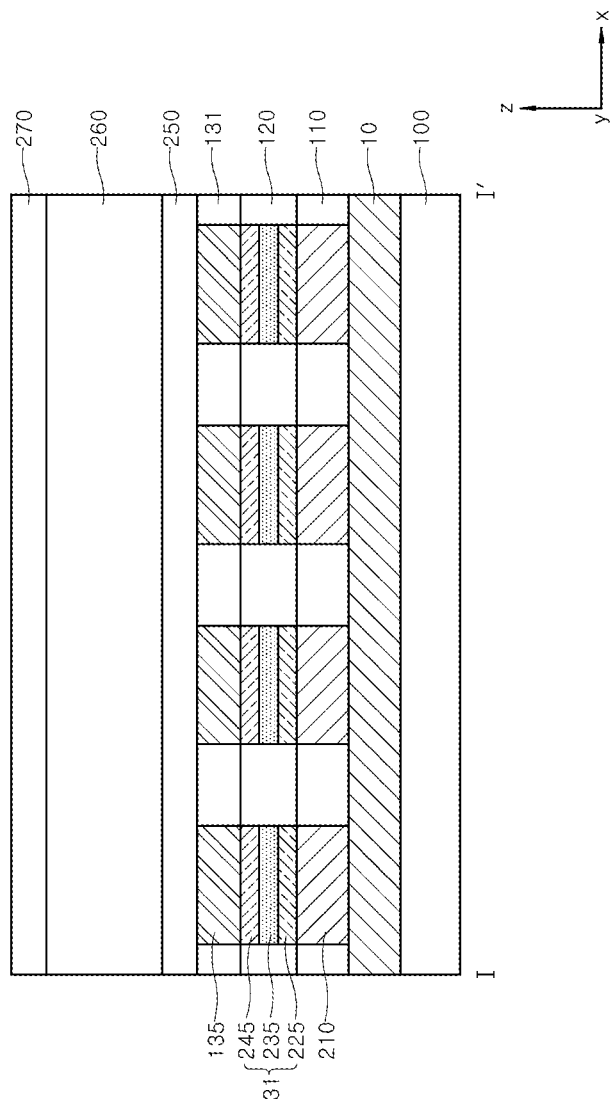

Referring to FIG. 9, a first conductive layer 250, a variable resistance film 260, and a second conductive layer 270 may be sequentially formed over the plurality of switching film patterns 135 and the plurality of insulating film patterns 131. The first and second conductive layers 250 and 270 and the variable resistance film 260 may each be formed using a chemical vapor deposition method, an atomic layer deposition method, or both.

In one embodiment, a resistance-change memory (ReRAM) device is implemented. In this embodiment, the first and second conductive layers 250 and 270 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide (RuO2), or a combination thereof, as non-limiting examples.

In this embodiment, the variable resistance film 260 may include a metal oxide, as a non-limiting example. The metal oxide may include any of titanium oxide, aluminum oxide, nickel oxide, copper oxide, zirconium oxide, manganese oxide, hafnium oxide, tungsten oxide, tantalum oxide, niobium oxide, and iron oxide, as non-limiting examples. In one embodiment, the metal oxide may include oxygen vacancies. That is, the metal oxide may include a stoichiometrically deficient amount of oxygen atoms.

In another embodiment, the variable resistance film 260 may include a perovskite material including any of PCMO ($Pr_{0.7}Ca_{0.3}$ $MnO_3$), LCMO ($La_{1-x}Ca_xMnO_3$), BSCFO ($Ba_{0.5}Sr_{0.5}Co_{0.8}Fe_{0.2}O_{3-\delta}$), YBCO ($YBa_2Cu_3O_{7-x}$), (Ba, Sr)$TiO_3$(Cr, Nb-doped), $SrZrO_3$(Cr, V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the like, as non-limiting examples. In yet another embodiment, the variable resistance pattern 260 may include, for example, any of a selenide material, such as a $Ge_xSe_{1-x}$(Ag,Cu,Te-doped) or a metal sulfide material; an $Ag_2S$ material; a $Cu_2S$ material; a CdS material; and a ZnS material.

In another embodiment, a phase change memory element is implemented. In this embodiment, the first and second conductive layers 250 and 270 may include any of tungsten (W), aluminum (Al), copper (Cu), tantalum (Ta), titanium (Ti), molybdenum (Mo), tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, and impurity-doped polysilicon, as non-limiting examples.

In this embodiment, the variable resistance film 260 may include one or more chalcogenide-based compounds. The variable resistance film 260 may include, for example, germanium-antimony-tellurium (GST), arsenic-antimony-tellurium (As—Sb—Te), tin-indium-antimony-tellurium (Sn—In—Sb—Te), and arsenic-germanium-antimony-tellurium (As—Ge—Sb—Te). The variable resistance film 260 may include a chalcogenide compound comprising any of a Group 5A element-antimony-tellurium, a Group 6A element-antimony-tellurium, a Group 5A element-antimony-selenium, and a Group 6A element-antimony-selenium, as non-limiting examples.

In another embodiment, a magnetoresistance memory element may be implemented. In this embodiment, the first and second conductive layers 250 and 270 may include any of tungsten (W), aluminum (Al), copper (Cu), tantalum (Ta), titanium (Ti), molybdenum (Mo), tungsten nitride, aluminum nitride, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, and impurity-doped polysilicon, as non-limiting examples.

Although not illustrated, the variable resistance film 260 may include a free layer, a tunnel barrier layer, and a fixed layer. The free layer may include one or more ferromagnetic materials, such as any of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), and so on. The tunnel barrier layer may be disposed between the free layer and the fixed layer. The tunnel barrier layer may include one or more materials, such as any of magnesium oxide (MgO) and aluminum oxide ($Al_2O_3$), as non-limiting examples. The magnetization direction of the electrons of the fixed layer may be fixed. The fixed layer may include one or more ferromagnetic materials, such as any of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), and so on.

Figure 10:
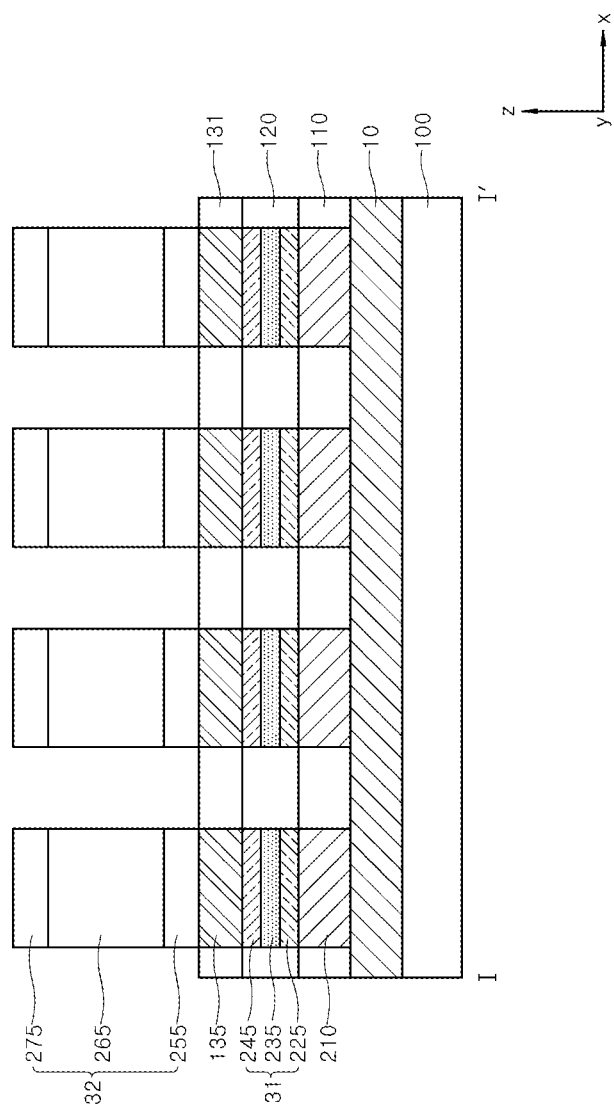

Referring to FIG. 10, a plurality of memory structures 32 may be formed on the switching film patterns 135, respectively, by patterning the first conductive layer 250, the variable resistance film 260, and the second conductive layer 270. In one embodiment, the method of forming the memory structures 32 may proceed as follows. A pillar forming mask pattern (not illustrated) may be formed on the second conductive layer 270 of FIG. 9. Next, the second conductive layer 270, the variable resistance film 260, and the first conductive layer 250 may be etched using the pillar forming mask pattern to form pillar-shaped structures, each of the pillar-shape structure including a second memory electrode layer pattern 275, a memory film pattern 265, and a first memory electrode layer pattern 255. Portions of each of the pillar-shaped structures may be formed to overlap with the switching film patterns 135, respectively.

Figure 11:
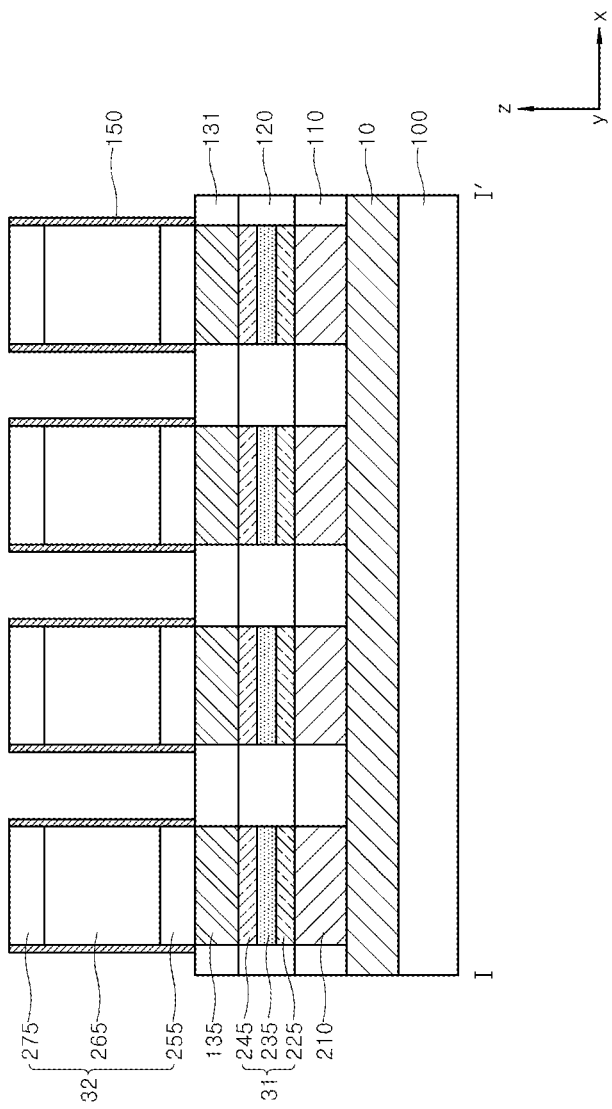

Referring to FIG. 11, insulating spacers 150 may be formed on side surfaces of the plurality of memory structures 32. In one embodiment, the process of forming the insulating spacers 150 may proceed as follows. A nitride film may be formed over the substrate 100 and the memory structures 32, which are formed on the substrate 100. In an embodiment, the nitride film may be formed along a profile of a resulting structure of FIG. 10. The nitride film may be formed using a chemical vapor deposition method or an atomic layer deposition method. The nitride film is then etched back to form nitride spacers on the side surfaces of the memory structures 32. As an example, the nitride film may include silicon nitride. The memory structures 32 may be insulated from each other by the insulating spacers 150 disposed on the side surfaces of the memory structures 32.

Figure 12:
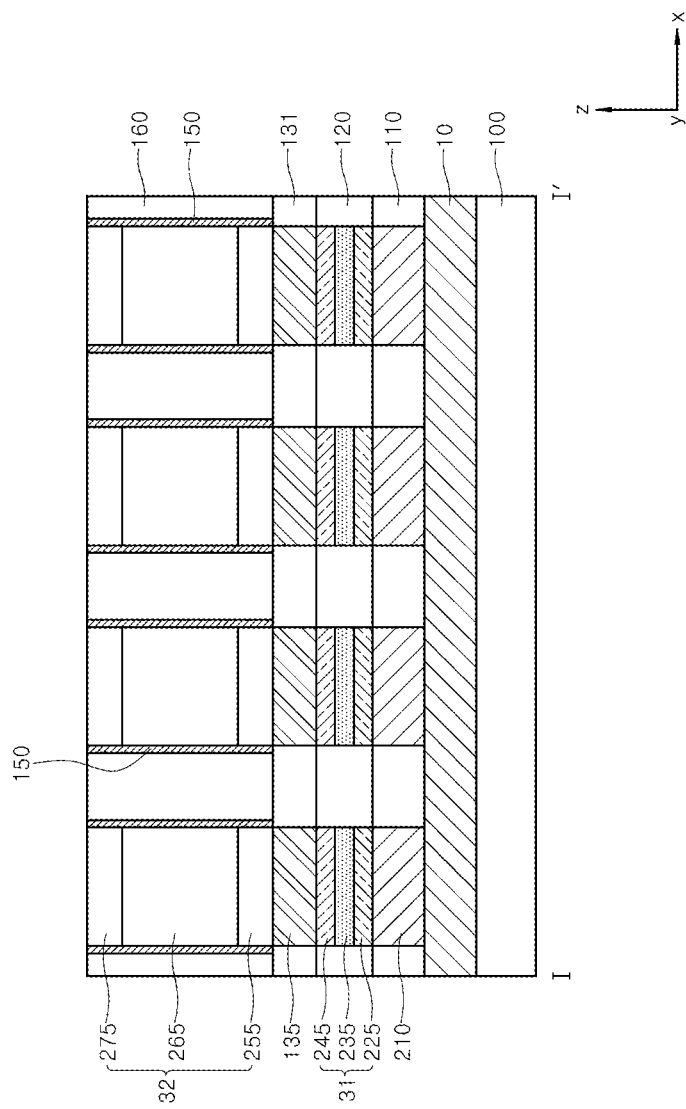

Referring to FIG. 12, spaces located between the plurality of memory structures 32 and over the substrate 100, may be filled with an insulating material 160. In a specific embodiment, an insulating oxide film may be formed between the memory structures 32, which are partially covered with the insulating spacers 150. Next, the insulating material 160 may be polished and planarized, so that an upper surface of the insulating material 160 and upper surfaces of the memory structures 32 are coplanar.

Figure 13:
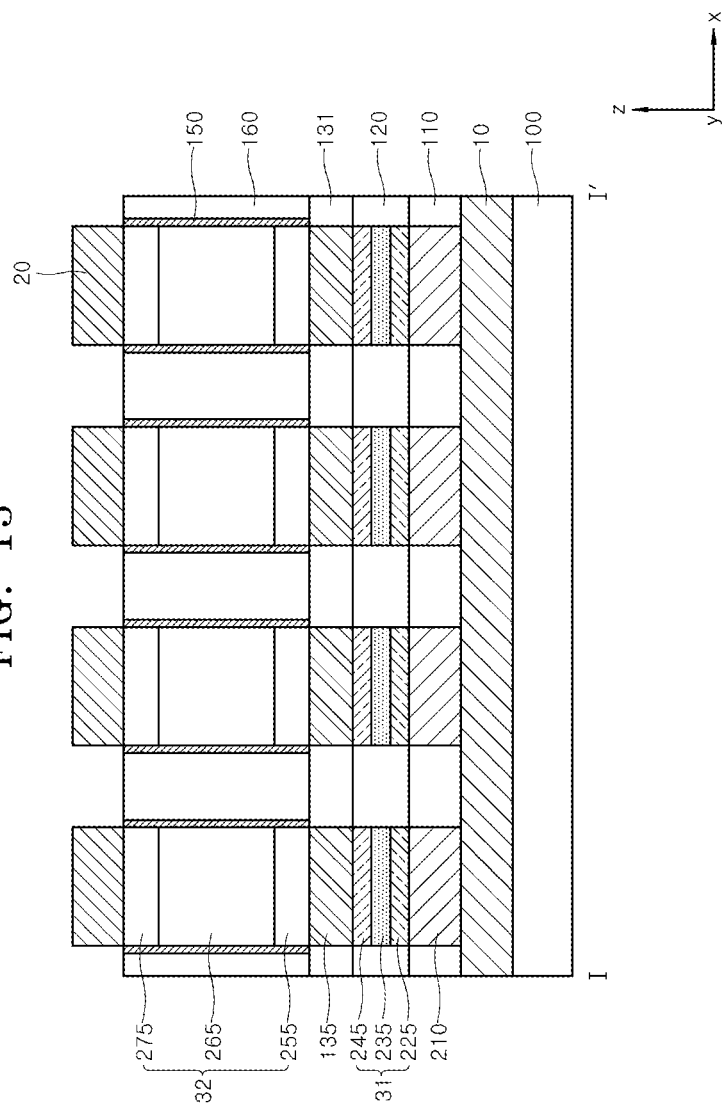

Referring to FIG. 13, second conductive line patterns 20 may be formed over the plurality of memory structures 32. In one embodiment, the process of forming the second conductive line patterns 20 may proceed as follows. A conductive layer may be formed over the memory structures 32 and the insulating material 160. The conductive layer may be patterned to form conductive line patterns, which extend in a second direction. In this case, the second direction may be nonparallel to the first direction, in which the first conductive line patterns 10 extend.

The second conductive line patterns 20 may be electrically connected to the second memory electrode layer patterns 275. The second conductive line patterns 20 may include any of a metal, a conductive metal nitride, and a conductive metal oxide, as non-limiting examples. Each of the second conductive line patterns 20 may be shared by multiple unit cell structures 30. For example, each of the second conductive line patterns 20 may be electrically connected to multiple second memory electrode layer patterns 275 arranged along the second direction.

By proceeding with the above-described processes, a cross-point memory array device according to an embodiment of the present disclosure can be manufactured. The cross-point memory array device may include a plurality of unit cell structures coupled between the first conduction line patterns 10 and the second conduction line patterns 20. Each unit cell structure may include a corresponding resistive element structure 31, a corresponding switching film pattern 135, and a corresponding memory structure 32. In an embodiment, the insulating spacers 150 may be disposed on the side surfaces of the memory structures 32. In this embodiment, the insulating spacers 150 may be omitted from being disposed on the side surfaces of the insulating film patterns 135 and the resistive element structures 31. The insulating spacers 150 disposed on the side surfaces of the memory structures 32 may include a nitride material, which may inhibit lateral oxidation of the memory structures 32.

The switching film patterns 135 may be doped regions of an insulating layer containing an insulative oxide. Undoped regions of the insulating layer may surround the switching film patterns 135. Thus, the electrical insulation of the switching film patterns 135 in a vertical direction and a lateral direction can be improved.

FIGS. 14 to 18 are cross-sectional views schematically illustrating a method of manufacturing a cross-point memory array device according to another embodiment of the present disclosure. FIGS. 14 to 18 are process diagrams corresponding to cross sections taken along line I-I' of the cross-point array device illustrated in FIG. 1 according to another embodiment of the present disclosure.

Figure 14:
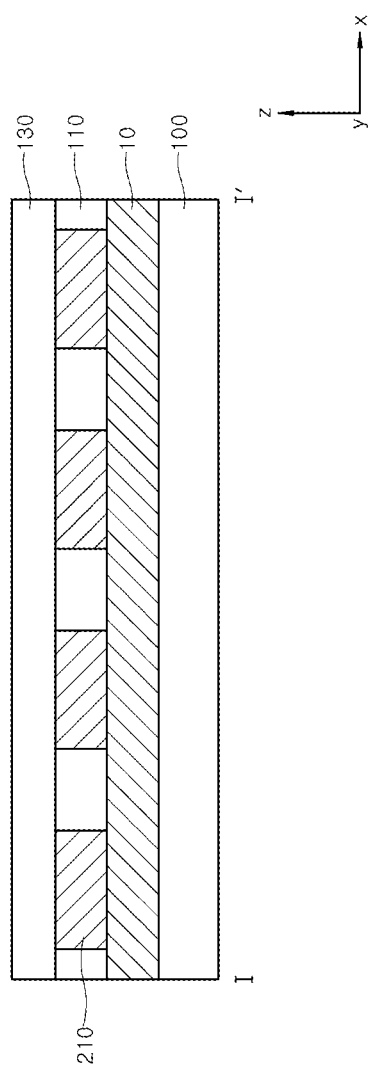
FIGS. 14 to 18 are cross-sectional views schematically illustrating a method of manufacturing a cross-point memory array device according to another embodiment of the present disclosure.

Referring to FIG. 14, first conductive line patterns 10 may be formed on a substrate 100. The method of forming the first conductive line patterns 10 on the substrate 100 may be substantially the same as the method described above with reference to the embodiment of FIG. 5. The first conductive line patterns 10 and a base insulating layer (not illustrated) can be formed on the substrate 100. The base insulating layer may be disposed in spaces between the first conductive line patterns 10.

Next, contact plugs 210, and a first insulating layer 110 surrounding the contact plugs 210, may be formed on the first conductive line patterns 10 and the base insulating layer. The method of forming the contact plugs 210 and the first insulating layer 110 may be substantially the same as the method described above with reference to the embodiment of FIG. 6.

Then, an insulating layer 130 including an insulative oxide may be formed on the contact plugs 210 and the first insulating layer 110. The method of forming the insulating layer 130 may be substantially the same as the method described above with reference to the embodiment of FIG. 7.

Figure 15:
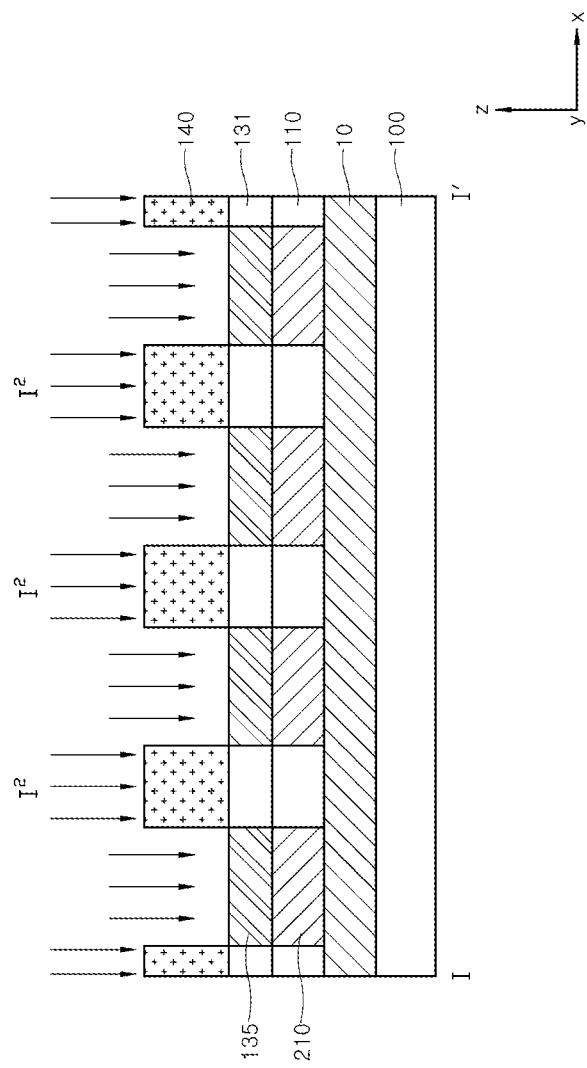

Referring to FIG. 15, an ion implantation mask pattern 140 may be formed on the insulating layer 130. Regions of the insulating layer 130 may be selectively exposed by the ion implantation mask pattern 140. Subsequently, a dopant $I^2$ may be implanted into the regions of the insulating layer 130 that are selectively exposed by the ion implantation mask pattern 140. As a result, switching film patterns 135 may be formed from the regions of the insulating layer 130 doped with the dopant $I^2$, and insulating film patterns 131 may be formed from regions of the insulating layer 130 that are not implanted with the dopant $I^2$.

The method of forming the switching film patterns 135 and the insulating film patterns 131 may be substantially the same as the method described above with reference to the embodiment of FIG. 7. After the ion implantation process is completed, the ion implantation mask pattern 140 may be removed.

Figure 16:
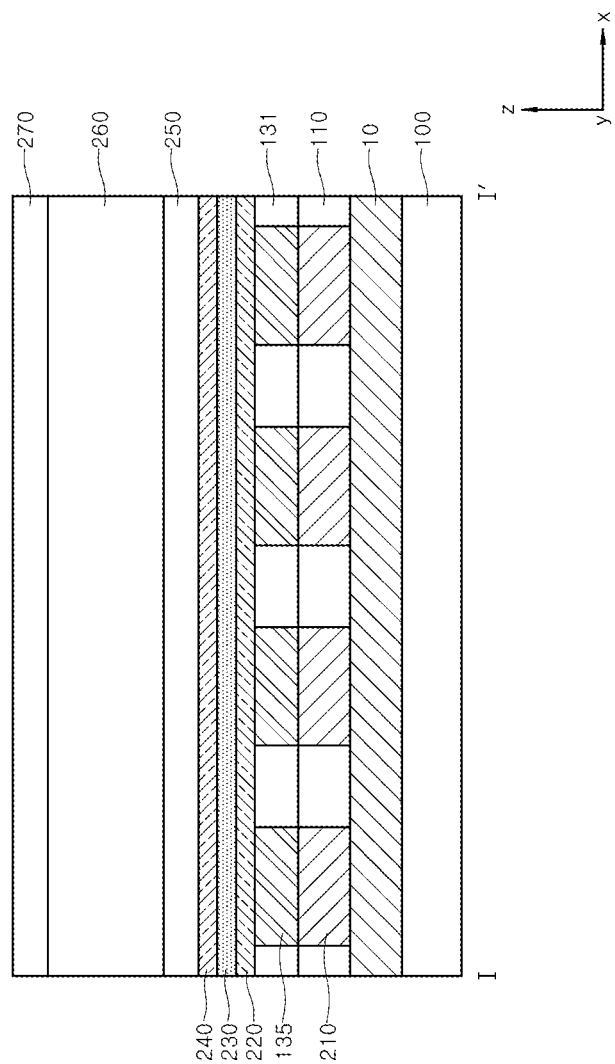

Referring to FIG. 16, a first electrode layer 220, a resistive film 230, a second electrode layer 240, a first conductive film 250, a variable resistance film 260, and a second conductive film 270 may be sequentially formed over the switching film patterns 135 and the insulating film patterns 131. The method of forming the above-described layers and films may be substantially the same as the methods described above with reference to the embodiments of FIGS. 6 and 9.

Figure 17:
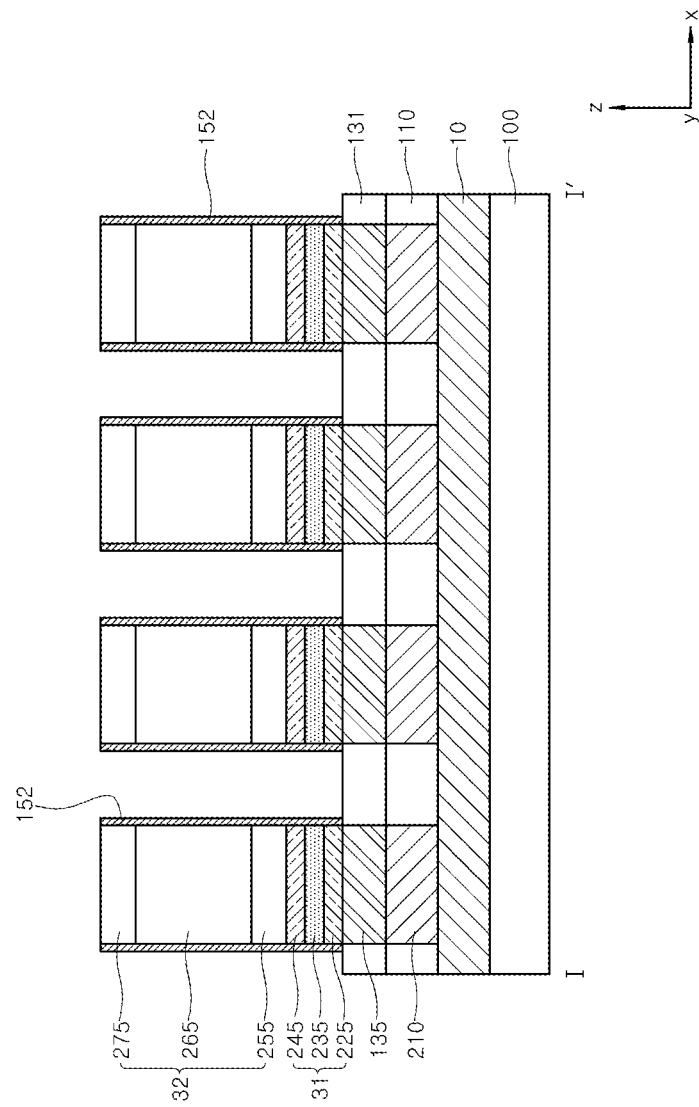

Referring to FIG. 17, the second conductive film 270, the variable resistance film 260, the first conductive film 250, the second electrode layer 240, the resistive film 230, and the first electrode layer 220 may be sequentially etched to form resistive element structures 31 and memory structures 32. The resistive element structure 31 includes a first electrode layer pattern 225, a resistive layer pattern 235, and a second electrode layer pattern 245 that are formed by selectively etching the first electrode layer 220, the resistive film 230, and the second electrode layer 240, respectively. The memory structure 32 includes a first memory electrode layer pattern 255, a memory film pattern 265, and a second memory electrode layer pattern 275 that are formed by selectively etching the first conductive film 250, the variable resistance film 260, and the second conductive film 270, respectively.

Next, insulating spacers 152 may be formed on side surfaces of the resistive element structures 31 and the memory structures 32. In one embodiment, the process of forming the insulating spacers 152 may proceed as follows. A nitride film may be formed over the substrate 100 and the resistive element structures 31 and the memory structures 32, which are formed on the substrate 100. In an embodiment, the nitride film may be formed along a profile of a resulting structure after the etching process. The nitride film may be formed using a chemical vapor deposition method or an atomic layer deposition method. Subsequently, the nitride film may be etched back to form the insulating spacers 152 on the side surfaces of the resistive element structures 31 and the memory structures 32. As an example, the nitride film and the insulating spacers 152 may include silicon nitride.

Figure 18:
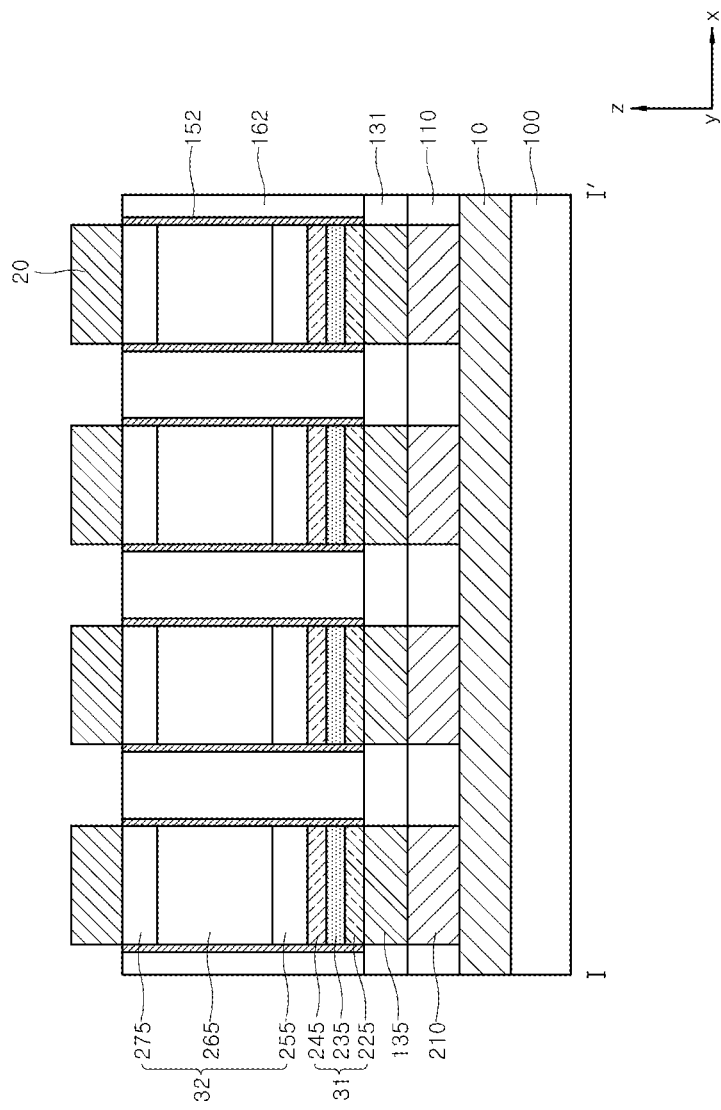

Referring to FIG. 18, insulating material 162 may be formed over the substrate 100, and may fill spaces between the plurality of resistive element structures 31 and spaces between the plurality of memory structures 32. In a specific embodiment, an insulative oxide film may be formed between the resistive element structures 31 and the memory structures 32, which are partially covered with the insulating spacers 152. Then, the insulating material may be polished and planarized so that an upper surface of the insulating material 162 and upper surfaces of the memory structures 32 are coplanar.

Next, second conductive line patterns 20 may be formed over the plurality of memory structures 32. The method of forming the second conductive line patterns 20 may be substantially the same as the method described above with reference to the embodiment of FIG. 13.

Through the above-described processes, a cross-point memory array device according to the present embodiment can be manufactured. In this embodiment, the resistive element structures 31 may be disposed between the switching film patterns 135 and the memory structures 32. The resistive element structures 31 each have a predetermined resistance, which can set an upper limit of an operating current passing through respective unit cell structures.

In some embodiments, either one of the second electrode layer pattern 245 of each resistive element structure 31, and the first memory electrode layer pattern 255 of each memory structure 32, may be omitted.

FIGS. 19 to 23 are cross-sectional views schematically illustrating a method of manufacturing a cross-point memory array device according to still another embodiment of the present disclosure. FIGS. 19 to 23 are process diagrams corresponding to cross sections taken along line I-I' of the cross-point array device illustrated in FIG. 1 according to still another embodiment of the present disclosure.

Figure 19:
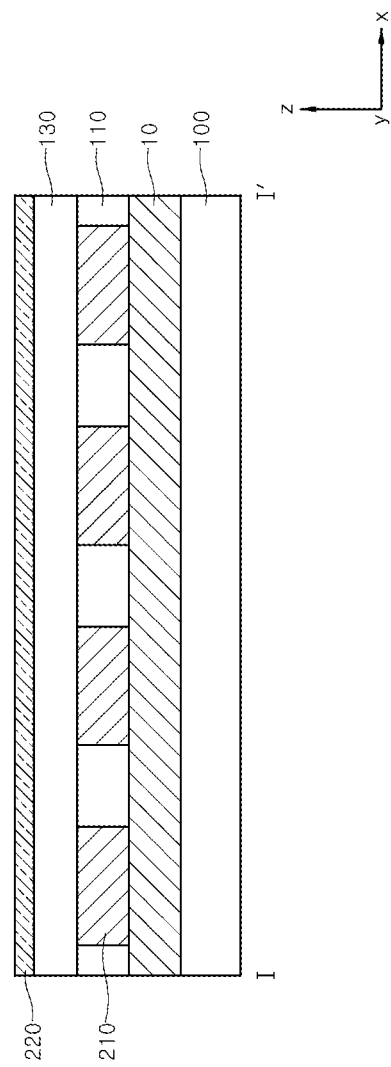
FIGS. 19 to 23 are cross-sectional views schematically illustrating a method of manufacturing a cross-point memory array device according to still another embodiment of the present disclosure.

Referring to FIG. 19, first conductive line patterns 10 and a base insulating layer (not illustrated) may be formed on a substrate 100. The first conductive line patterns 10 may extend in a first direction, e.g., an x direction. The base insulating layer may be disposed in spaces between the first conductive line patterns 10.

Then, contact plugs 210 and a first insulating layer 110 may be formed on the first conductive line patterns 10 and the base insulating layer. Next, an insulating layer 130 including an insulative oxide may be formed over the contact plugs 210 and the first insulating layer 110. Accordingly, a stacked structure, which includes the first conductive line patterns 10, the base insulating layer, the first insulating layer 110, the contact plugs 210, and the insulating layer 130, is formed over the substrate 100. The method of forming the stacked structure may be substantially the same as the method described above with reference to the embodiment of FIG. 14.

Next, a first electrode layer 220 may be formed on the insulating layer 130. The method of forming the first electrode layer 220 may be substantially the same as the method described above with reference to the embodiment of FIG. 16.

Figure 20:
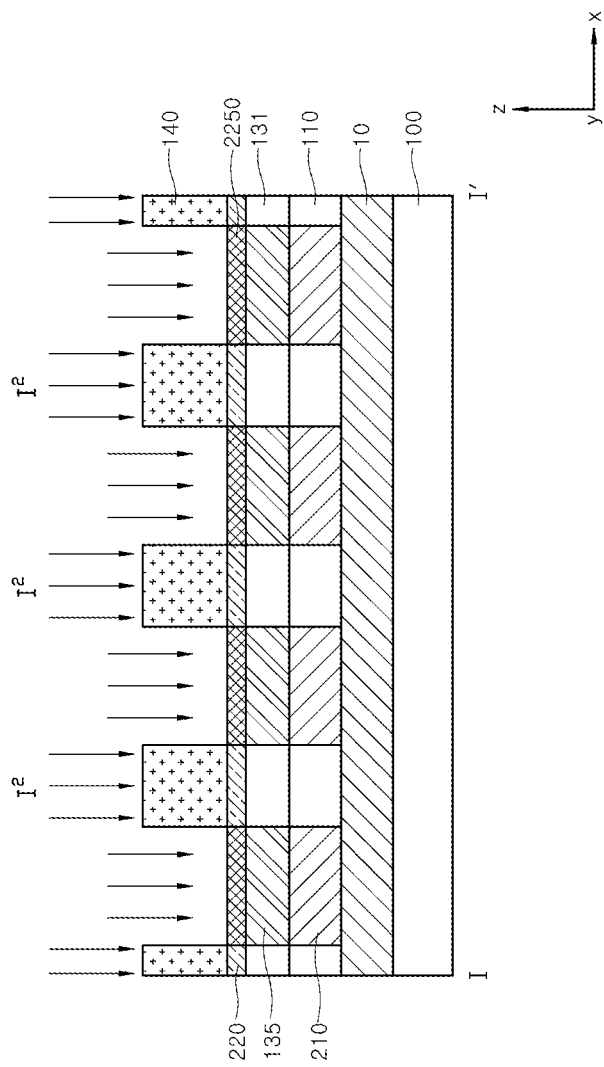

Referring to FIG. 20, an ion implantation mask pattern 140 may be formed on the first electrode layer 220, and may selectively expose the first electrode layer 220. Subsequently, regions of the first electrode layer 220 and regions of the insulating layer 130, which are selectively exposed by the ion implantation mask pattern 140, are doped with a dopant $I^2$ by an ion implantation process. As a result, switching film patterns 135 may be formed in the regions of the insulating layer 130 that are doped with the dopant $I^2$, and insulating film patterns 131 may be formed in regions of the insulating layer 130 in which the dopant $I^2$ is not implanted. Also, doped regions 2250 of the first electrode layer 220 may be formed in the regions of the first electrode layer 220 that are doped with the dopant $I^2$. After the ion implantation process is completed, the ion implantation mask pattern 140 may be removed.

Figure 21:
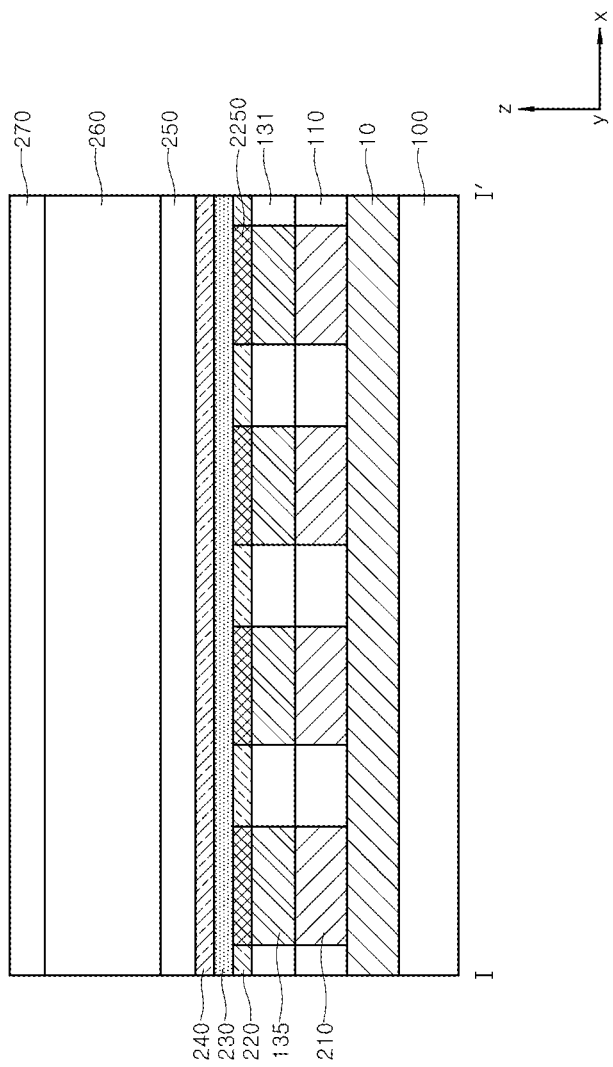

Referring to FIG. 21, a second resistive film 230, a second electrode layer 240, a first conductive film 250, a variable resistance film 260, and a second conductive film 270 may be formed on the first electrode layer 220 including the doped regions 2250. The method of forming the above-described films and layer may be substantially the same as the method described above with reference to the embodiment of FIG. 16.

Figure 22:
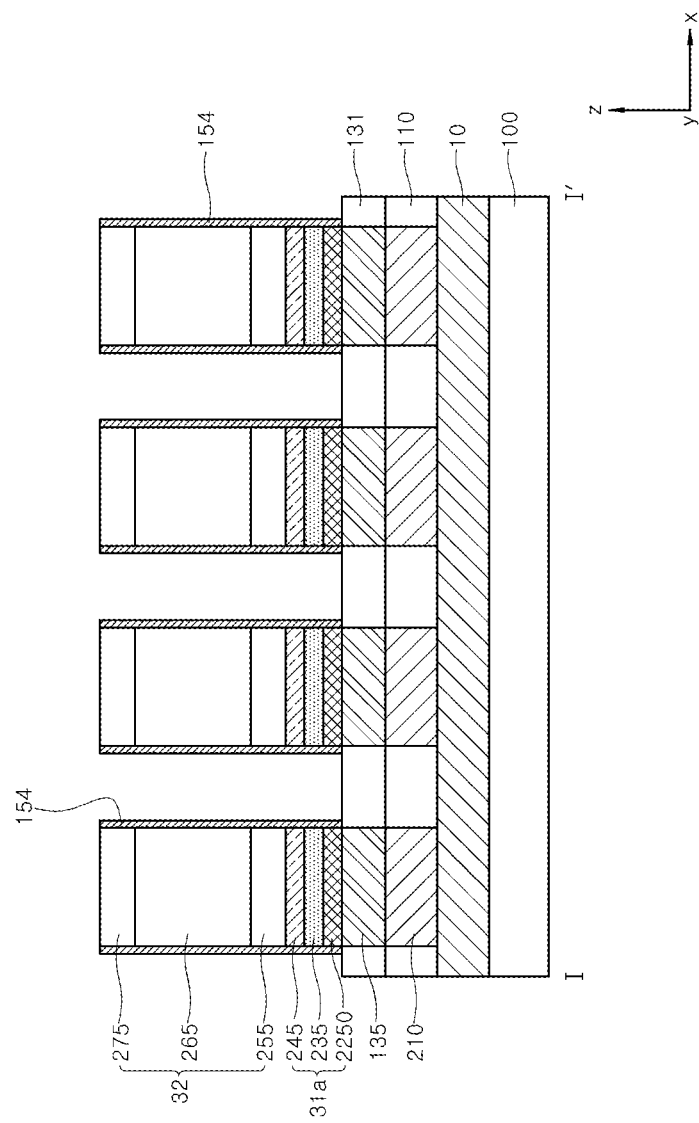

Referring to FIG. 22, the second conductive film 270, the variable resistance film 260, the first conductive film 250, the second electrode layer 240, the resistive film 230, and the first electrode layer 220 may be sequentially etched to form resistive element structures 31a and memory structures 32. The resistive element structure 31a includes the doped regions 2250 of the first electrode layer 220, a resistive layer pattern 235, and a second electrode layer pattern 245 that are formed by selectively etching the first electrode layer 220 including the doped regions 2250, the resistive film 230, and the second electrode layer 240, respectively. The memory structure 32 includes a first memory electrode layer pattern 255, a memory film pattern 265, and a second memory electrode layer pattern 275 that are formed by selectively etching the first conductive film 250, the variable resistance film 260, and the second conductive film 270, respectively.

Insulating spacers 154 may be then formed on side surfaces of the resistive element structures 31a and the memory structures 32. The method of forming the resistive element structures 31a, the memory structures 32, and the insulating spacers 154 may be substantially the same as the method described above with reference to the embodiment of FIG. 17.

Figure 23:
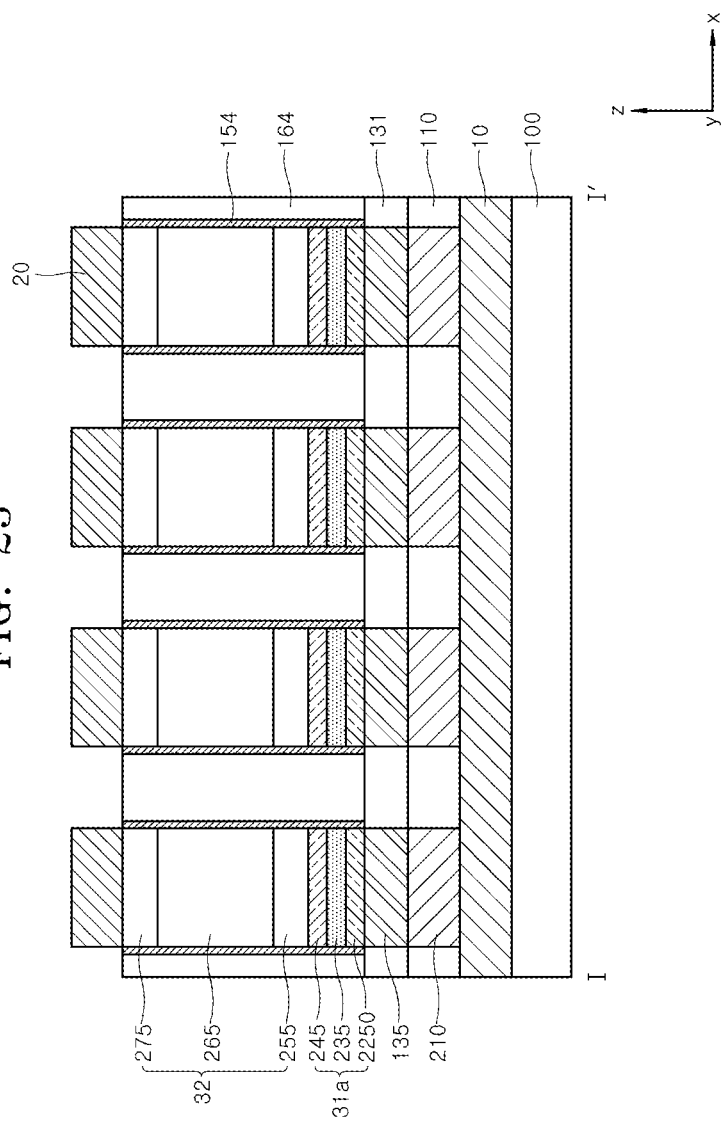

Referring to FIG. 23, a plurality of spaces between the resistive element structures 31 and memory structures 32 are filled with an insulating material 164. Second conductive line patterns 20 are then formed on the plurality of memory structures 32. In an embodiment, the second conductive line patterns 20 extend in a second direction that is nonparallel to the first direction. The method of forming the insulating material 164 and the second conductive line patterns 20 is substantially the same as the method described above with reference to the embodiment of FIG. 18.

Through the above-described processes, a cross-point memory array device according to the present embodiment can be manufactured. In this embodiment, portions of the insulating layer 130 in which the switching film patterns 135 are formed are covered with the first electrode layer 220, and then an ion implantation process is performed. Thus, when the ion implantation process proceeds, the first electrode layer 220 prevents the switching film patterns 135 from being physically damaged.

In this embodiment, the resistive element structures 31a may be disposed between the switching film patterns 135 and the memory structures 32. The resistive element structures 31a each have a predetermined resistance, which can set an upper limit of an operating current passing through the corresponding unit cell structure.

In some other embodiments, either one of the second electrode layer patterns 245 of the resistive element structures 31a, and the first memory electrode layer patterns 255 of the memory structures 32, may be omitted.

The embodiments of the present disclosure have been disclosed above for illustrative purposes. Those of ordinary skill in the art will appreciate that various modifications, additions and substitutions are possible, without departing from the scope and spirit of the present disclosure as disclosed in the accompanying claims.

What is claimed is:

1. A cross-point memory array device comprising:
a plurality of first conductive line patterns disposed on a substrate, the plurality of first conductive line patterns extending in a first direction;
an insulating layer disposed on the first conductive line patterns, the insulating layer including a plurality of insulating film patterns and a plurality of switching film patterns;
a plurality of memory structures disposed on the plurality of switching film patterns, respectively; and
a plurality of second conductive line patterns disposed on the plurality of memory structures, the plurality of second conductive line patterns extending in a second direction that is nonparallel to the first direction,
wherein each of the plurality of switching film patterns has a variable resistance characteristic,
wherein the plurality of insulating film patterns comprise an oxide material and the plurality of switching film patterns comprise the oxide material with an dopant,
wherein the device further comprises a plurality of resistive element structures electrically connected in series to the plurality of switching film patterns, respectively, and to the plurality of memory structures, respectively,
wherein the plurality of resistive element structures each have an electrical resistance, and
wherein the plurality of resistive element structures prevent an operating current flowing through the switching film patterns and the memory structures from exceeding an upper limit.

2. The cross-point memory array device of claim 1, wherein the insulating layer comprises one or more of silicon oxide, aluminum oxide, and zirconium oxide.

3. The cross-point memory array device of claim 2, wherein the dopant comprises at least one selected from boron (B), nitrogen (N), carbon (C), phosphorus (P), aluminum (Al), lanthanum (La), niobium (Nb), vanadium (V), tantalum (Ta), tungsten (W), chromium (Cr), and molybdenum (Mo).

4. The cross-point memory array device of claim 1, wherein the insulating film pattern surrounds the switching film pattern.

5. The cross-point memory array device of claim 1, further comprising:
a plurality of insulating spacers disposed on side surfaces of the plurality of memory structures; and
an insulating material filling spaces between the plurality of memory structures and being disposed over the substrate.

* * * * *